(12) United States Patent
Kudelka et al.

(10) Patent No.: US 6,559,002 B1
(45) Date of Patent: May 6, 2003

(54) ROUGH OXIDE HARD MASK FOR DT SURFACE AREA ENHANCEMENT FOR DT DRAM

(75) Inventors: Stephan Kudelka, Ottendorf-Orkrilla (DE); Helmut Horst Tews, Poughkeepsie, NY (US); Stephen Rahn, Hoehenkirchen-Siegertsbrunn (DE); Irene McStay, Hopewell Junction, NY (US); Uwe Schroeder, Dresden-Klotzsche (DE)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/032,041

(22) Filed: Dec. 31, 2001

(51) Int. Cl.$^7$ .......................................... H01L 21/8242
(52) U.S. Cl. ..................... 438/243; 438/244; 438/386; 438/387; 438/964
(58) Field of Search .................. 438/964, 243–246, 438/386–389

(56) References Cited

U.S. PATENT DOCUMENTS

| | | | |
|---|---|---|---|
| 5,340,763 A | 8/1994 | Dennison | 437/52 |
| 5,444,653 A | 8/1995 | Nagasawa | 365/149 |
| 5,814,549 A * | 9/1998 | Wu | 438/398 |
| 5,877,061 A * | 3/1999 | Halle et al. | 438/386 |
| 5,981,350 A * | 11/1999 | Geusic et al. | 438/386 |
| 6,037,220 A | 3/2000 | Chien | 438/255 |
| 6,232,171 B1 | 5/2001 | Mei | 438/246 |
| 6,448,131 B1 * | 9/2002 | Cabral et al. | 438/243 |
| 6,455,369 B1 * | 9/2002 | Forster et al. | 438/249 |
| 2002/0106857 A1 * | 8/2002 | Jammy et al. | 438/256 |

* cited by examiner

*Primary Examiner*—John F. Niebling
*Assistant Examiner*—Jennifer M. Kennedy
(74) *Attorney, Agent, or Firm*—Jerome J. Norris

(57) ABSTRACT

In a process for making a DT DRAM structure, the improvement of providing a surface area enhanced DT below the collar region and node capacitance that does not shrink with decreasing groundrule/cell size, comprising:

a) providing a semiconductor substrate having a collar region and an adjacent region below the collar region, the collar region having SiO deposited thereon;

b) depositing a SiN liner on said collar region and on the region below the collar;

c) depositing a layer of a-Si on the SiN liner to form a micromask;

d) subjecting the structure from step c) to an anneal/oxidation step under a wet environment at a sufficient temperature to form a plurality of oxide dot hardmasks;

e) subjecting the SiN liner to an etch selective to SiO;

f) subjecting the structure from step e) to a Si transfer etch using a chemical dry etch (CDE) selective to SiO to create rough Si surface;

g) stripping SiO and the SiN; and forming a node and collar deposition.

10 Claims, 3 Drawing Sheets

ROUGH OXIDE HARD MASK FOR DT SURFACE AREA ENHANCEMENT FOR DT DRAM

BACKGROUND OF THE INVENTION

1) Field of the Invention

The invention relates to a process for providing a rough Si surface on a Si sidewall during preparation of a DT DRAM, to obtain DT surface area enhancement for a DT DRAM by creating a rough oxide etch mask, based on an anneal/oxidation of deposited amorphous Si (a-Si) on a SiN liner. The process permits a process/integration scheme which allows the integration of this process into a collar process utilizing $SiO_2$ or SiN as the collar material.

2) Description of the Prior Art

It is known that node capacitance requirements for DT DRAM devices does not shrink with decreasing groundrule/cell size. Moreover, extendability of current processes such as wet bottle and deeper trench etchings does not provide sufficient surface area enhancement for the DT DRAM devices.

For example, the use of sub-micron features for fabrication of a DRAM device in which the capacitor of the DRAM device is a stacked capacitor structure creates problems when attempts are made to increase the capacitance. In this connection, it should be noted that a DRAM cell is generally comprised of a stacked capacitor structure that overlies a transfer gate transistor, and is connected to the source of the transfer gate transistor. The decreasing size of the transfer gate transistor limits the dimensions of the stacked capacitor structure. Therefore, to increase the capacitance of the stacked capacitor structure, which is comprised of two electrodes separated by a dielectric layer, the thickness of the dielectric layer must be decreased or the area of the capacitor must be increased. However, advancement of the DRAM technology to densities of 64 million cells per chip or greater results in a cell in which a smaller transfer gate transistor is used, thereby resulting in less of an overlying area for placement of overlying stacked capacitor structures.

U.S. Pat. No. 5,340,763 describes a method of maintaining or increasing stacked capacitor structure capacitance, while decreasing the lateral dimension of the capacitor by use of a rough or hemispherical grained (HSG) polysilicon layers. Nevertheless, the capacitance increase realized in this patent is limited by subjecting only the top surface of the polysilicon lower electrode to the HSG polysilicon deposition and etch procedure, thereby leaving the sides of the polysilicon lower electrode flat.

Hemispherical grained (HSG) polysilicon layers have also been used as overlying layers on conventional polysilicon structures, as described in U.S. Pat. No. 5,444,653. This patent specifically describes a storage node, or lower electrode of a stacked capacitor structure, in which the surface area of a polysilicon lower electrode structure is increased by deposition of an HSG polysilicon layer on an insulator layer, which overlies the top surface of the lower electrode structure. Subsequent etching procedures result in a transfer of the roughened surface created by the HSG polysilicon layer to only the top surface of the polysilicon lower electrode structure. The roughened, top surface of the polysilicon lower electrode, with increased surface area results in a capacitance increase for the subsequent capacitor structure.

U.S. Pat. No. 6,037,220 disclose a process for increasing the surface area of a polysilicon lower electrode, or storage node electrode, by forming an HSG polysilicon layer only on the sides of the storage node electrode, while maintaining a flat, or non-roughened, top surface. This configuration is a result of using a silicon oxide hard mask, overlying the top surface of the lower electrode structure, therefore accepting the HSG polysilicon deposition. The use of the silicon oxide hard mask, prevents the deleterious attack of the polysilicon lower electrode structure, during an HSG polysilicon etch back procedure, performed to remove unwanted HSG polysilicon from non-capacitor regions.

This patent also describes an iteration in which the HSG polysilicon-silicon oxide, hard mask features are prepared on the top surface of the polysilicon lower electrode structure, then used as a mask, to remove polysilicon from the spaces exposed between the HSG polysilicon-silicon oxide features. The etch process results in a roughened, polysilicon lower electrode, top surface, and along with the HSG polysilicon coated sidewalls, provide greater surface area increases than counterparts fabricated with only roughened sides, or with only a roughened top surface.

U.S. Pat. No. 6,232,171 B1 disclose a method for enlarging the sidewall surface of a deep trench with improved process precision (without depending upon the differential etch rate between doped and undoped silicon) so that the sidewall surface enlargement is optimally and most effectively controlled within a lower portion of the sidewall where a tapered-down trench diameter distribution is encountered due to the reduced trench opening on a deep sub-micron semiconductor device and the large aspect ratio (length-to-diameter ratio) of the vertically oriented trench. When this method is incorporated into a process for making deep trench capacitors, the method comprises:

(1) forming a deep trench into an active (i.e., conducting) region in a substrate;

(2) filling the deep trench with a dielectric material, typically an oxide;

(3) etching the dielectric material down to a predetermined depth;

(4) forming a thin oxidative layer, using a thermal oxidation procedure, on the sidewall of the trench above the dielectric material and on the top surface around the trench for stress relief;

(5) forming a nitride layer covering the thin oxide layer;

(6) using an anisotropic etching procedure to form a nitride sidewall spacer from the nitride layer;

(7) removing the dielectric material by a selective wet etching to expose the sidewall of the trench below the nitride sidewall spacer;

(8) using the nitride sidewall spacer as a mask, thermally oxidizing the portion of the substrate behind the sidewall of the trench below the nitride sidewall spacer to a predetermined penetration; and (9) removing the oxidized silicon sidewall and the nitride sidewall spacer, either simultaneously or separately.

In view of the fact that node capacitance requirements for DT DRAM technology does not shrink with decreasing groundrule/cell size, and in view of the fact that extendability of current processes such as wet bottle and deeper trench etching do not provide sufficient surface area enhancement, there is a need for additional processes for surface area increases when preparing DT DRAM devices.

SUMMARY OF THE INVENTION

One object of the present invention is to provide a process for surface area enhancement or increases for DT DRAM devices of densities of 64 million cells per chip, or greater.

Another object of the present invention is to provide a process for surface area enhancement or increases for DT DRAM devices utilizing a rough Si surface that is a rough mask material that can be used to transfer the pattern to the Si sidewall of the DT DRAM device.

A further object of the present invention is to provide a process for surface area enhancement for DT DRAM devices utilizing a process to create a rough oxide etch mask, based on the anneal/oxidation of deposited amorphous Si (a-Si) on a SiN liner.

A yet further object of the present invention is to provide a process integration scheme when providing surface area enhancement of a DT DRAM device which allows integration of this process into a collar process using $SiO_2$ or SiN as a collar material.

BRIEF DESCRIPTION OF THE DRAWING FIGURES

DESCRIPTION OF PREFERRED EMBODIMENT OF THE INVENTION

The method of forming the DT DRAM semiconductor structure to obtain an oxide hardmask for DT surface area enhancement and increased node capacitance, will now be described in detail.

Figure 1:
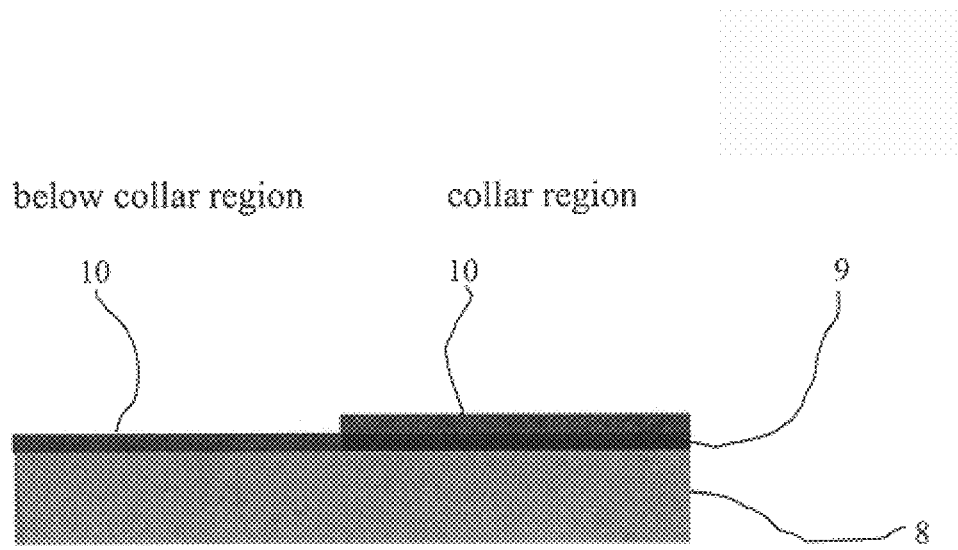
FIG. 1 depicts a step in the invention process in which SiN liner is deposited below the collar region and on the collar region of a semiconductor substrate.

Referring now to FIG. 1, there is shown a schematic of a DT DRAM with an area designated as a collar region and an area designated as the below collar region. On this structure, there is formed a SiN liner deposition 10 on a SiO layer 9, which has been deposited on a single crystal silicon, polycrystalline silicon or like semiconductor material From FIG. 2, it may be seen that, following the SiN liner deposition, an amorphous silicon (a-Si) layer 11 is deposited. Preferably, the a-Si layer is deposited in a thickness of about 100Å. At this juncture, it can be seen that the rough oxide mask has not yet been formed.

Figure 2:
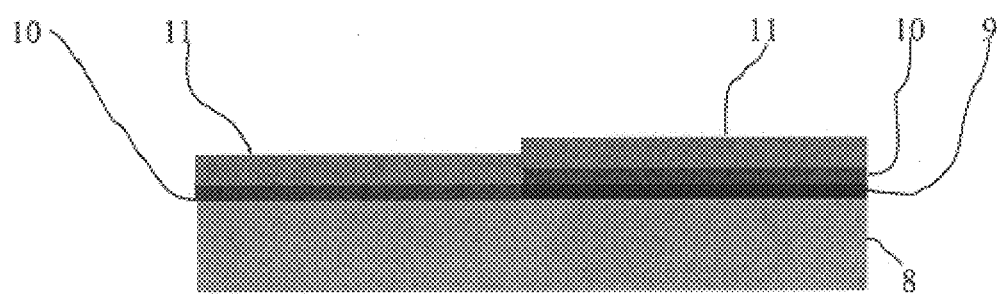
FIG. 2 depicts a step in the invention process in which amorphous silicon (a-Si) is deposited onto the SiN liner to form a micromask.
Figure 3:
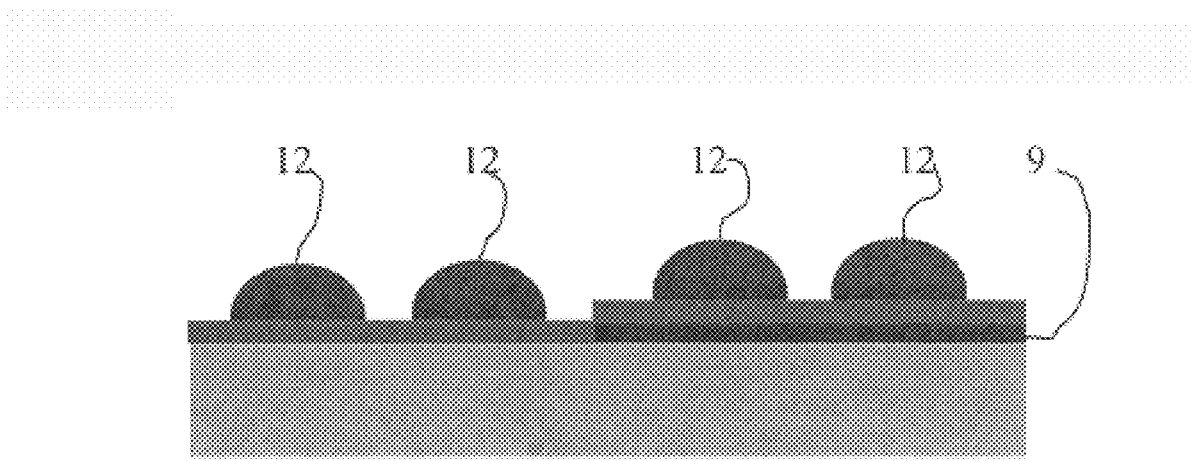
FIG. 3 depicts a step in the invention process of affecting an anneal/oxidation to form an oxide dot hardmask.
Figure 4:
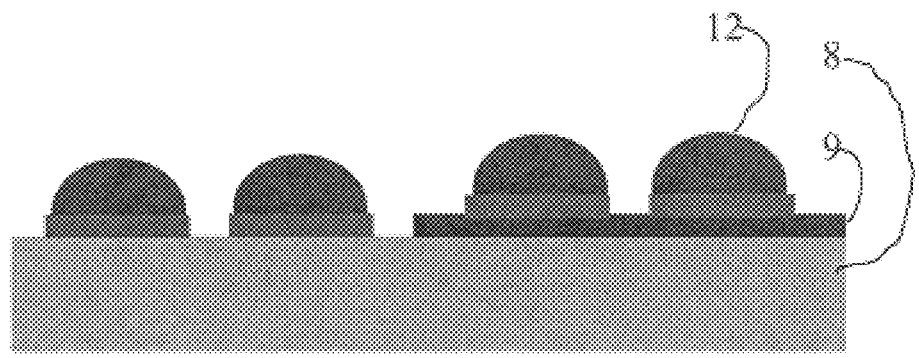
FIG. 4 depicts a step in the invention process of affecting a SiN liner etch, wherein the etch is selective to SiO.
Figure 5:
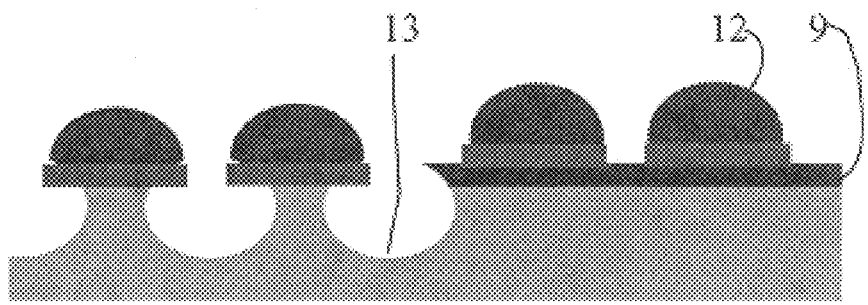
FIG. 5 depicts a step in the invention process in which a Si transfer etch (CDE) selective to SiO is affected to create rough Si surface.
Figure 6:
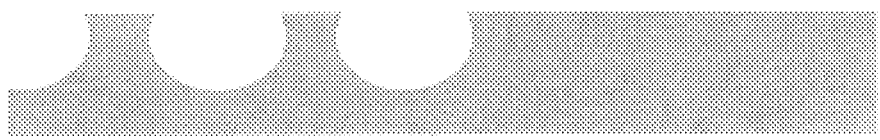
FIG. 6 depicts a step in the invention process in which there is affected a SiO plus SiN strip step that forms a surface enhanced DT. This step is followed by formation of a node plus collar deposition using $SiO_2$ or SiN as the collar material.

Following the steps of anneal/oxidation, preferably under wet conditions at a temperature of about 900° C., the structure of FIG. 2 is converted to that of FIG. 3, which shows the resulting oxide dot hard mask 12 that is used to transfer the pattern to the Si sidewall of the trench. Next, a SiN liner etch is affected that is selective to SiO, as is shown in FIG. 4. The etch step maybe performed using HF, a chemical dry etch (CDE) or a mixture of ethylene glycol (EG) and HF. Following the SiN liner etch shown in FIG. 4, a Si transfer etch is performed using chemical dry etching (CDE) that is selective to SiO to create a rough Si surface 13 that is shown in FIG. 5. After creation of the rough Si, as shown in FIG. 5, SiO and SiN are stripped to arrive at the structure shown in FIG. 6.

Formation of a node plus collar deposition using $SiO_2$ or SiN as the collar material is accomplished by integration of the invention process into a collar process.

Figure 7:
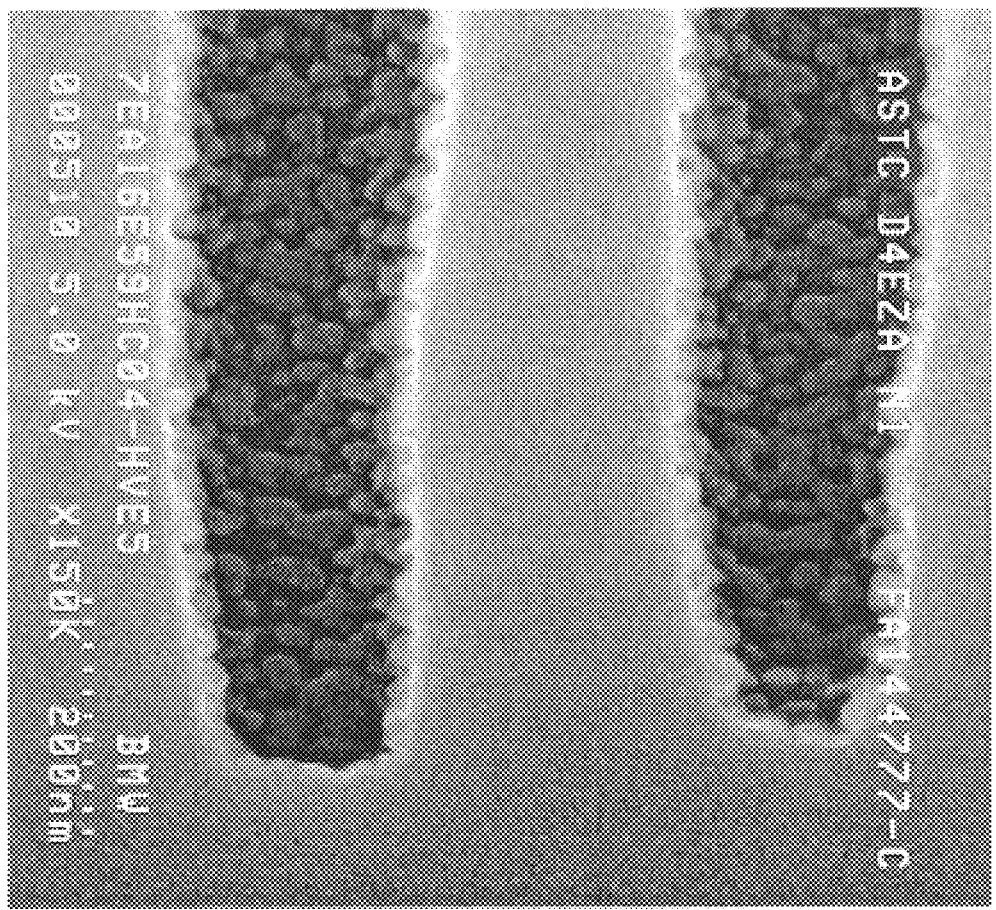
FIG. 7 shows a scanning electron micrograph (SEM) cross-section of oxide micromask after oxidation, as shown in FIG. 3.

As may be seen from FIG. 7, following anneal/oxidation, preferably under wet conditions at a temperature of about 900° C., there is formation of an oxide dot hardmask or micromask, which is depicted in the SEM cross-section showing the oxide micromask. The rough oxide mask formation using oxidation of the deposited a-Si onto the SiN liner is used to transfer the pattern to the Si sidewall, thereby providing DT surface area enhancement of the DRAM capacitor structure.

A key step in the creation of a rough Si surface is a rough mask material that is used to transfer the pattern to the Si sidewall. In essence, the invention process creates a rough oxide etch mask, based on the anneal/oxidation of deposited amorphous Si on the SiN liner. Further, the invention process/integration scheme allows integration of this process into a conventional collar process using $SiO_2$ or SiN as the collar material.

It will be seen that the invention consist of two aspects:

The formation of a rough oxide mask using oxidation of deposited a-Si onto a SiN liner for use as a micromask; and a scheme to integrate this process into a DT collar process.

We claim:

1. In a process for making a DT DRAM structure, the improvement of providing a surface area enhanced DT below the collar region and node capacitance that does not shrink with decreasing groundrule/cell size, comprising:
    a) providing a semiconductor substrate having a collar region and an adjacent region below said collar region, said collar region having SiO deposited thereon;
    b) depositing a SiN liner on said collar region and on said region below said collar;
    c) depositing a layer of a-Si on said SiN liner to form a micromask;
    d) subjecting the structure from step c) to an anneal/oxidation step under a wet environment at a sufficient temperature to form a plurality of oxide dot hardmasks;
    e) subjecting the SiN liner to an etch selective to SiO;
    f) subjecting the structure from step e) to a Si transfer etch using a chemical dry etch (CDE) selective to SiO to create rough Si surface;
    g) stripping SiO and the SiN; and forming a node and collar deposition.

2. The process of claim 1 wherein said a-Si layer is deposited in a thickness of about 100Å.

3. The process of claim 2 wherein said anneal/oxidation is at a temperature of about 900° C.

4. The process of claim 3 wherein said SiN liner etch is conducted using CDE.

5. The process of claim 3 wherein said SiN liner etch is conducted using HF.

6. The process of claim 3 wherein said SiN liner etch is conducted using a mixture of HF and ethylene glycol.

7. The process of claim 1 wherein the collar deposition of step g) is formed using $SiO_2$.

8. The process of claim 1 wherein the collar deposition of step g) is formed using SiN.

9. The process of claim 1 wherein said substrate is a single crystal silicon.

10. The process of claim 1 wherein said substrate is a polycrystalline silicon.

* * * * *